United States Patent
Akiyama

(10) Patent No.: US 6,202,187 B1
(45) Date of Patent: Mar. 13, 2001

(54) PATTERN GENERATOR FOR USE IN A SEMICONDUCTOR TEST DEVICE

(75) Inventor: Tsumtomu Akiyama, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/127,537

(22) Filed: Jul. 31, 1998

(30) Foreign Application Priority Data

Sep. 17, 1997 (JP) ................................................. 9-252493

(51) Int. Cl.[7] ............................. G01R 31/28; G06F 11/00
(52) U.S. Cl. ......................... 714/739; 714/722; 714/742
(58) Field of Search .................................... 714/728, 739, 714/742, 718, 720, 722, 738

(56) References Cited

U.S. PATENT DOCUMENTS 5,062,109 * 10/1991 Ohshima et al. .................... 714/719
5,481,671 * 1/1996 Fujisaki ................................... 714/8

* cited by examiner

Primary Examiner—Emmanuel L. Moise
(74) Attorney, Agent, or Firm—Flynn, Thiel, Boutell & Tanis, P.C.

(57) ABSTRACT

A pattern generator for use in a semiconductor test device provided with a random access memory which has large capacity and runs at high speed and is capable of generating random pattern data having large capacity and running at high speed. Parts of random pattern data previously stored in a sequential pattern memory are transferred to addresses of a random pattern memory which are specified by the difference calculated by an arithmetic circuit between address data outputted from a control circuit and address data outputted from an address generator, and the transferred random pattern data are outputted to a semiconductor to be tested through a selection circuit.

16 Claims, 4 Drawing Sheets

PATTERN GENERATOR FOR USE IN A SEMICONDUCTOR TEST DEVICE

BACKGROUND OF THE INVENTION

1. Field of the Invention

The present invention relates to a pattern generator for use in a semiconductor test device for generating random pattern data to supply to a semiconductor device to be tested.

2. Prior Art

The construction of a conventional pattern generator for use in a semiconductor test device will be described with reference to FIG. 4.

The pattern generator for use in a semiconductor test device comprises an address generator 10, a sequential pattern memory 11, a random pattern memory 12 and a selector 13. The address generator 10 generates address data 10a sequentially or at random in accordance with a previously written program, and supplies them to an input terminal of the sequential pattern memory 11 or an input terminal of the random pattern memory 12.

The address generator 10 is programmed to output a selection signal 10b in the manner of allowing the selector 13 to select data 11a outputted from the sequential pattern memory 11 when it generates the address data 10a sequentially or allowing the selector 13 to select data 12a outputted from the random pattern memory 12 when it generates the address data 10a at random.

Respective random pattern data are stored in respective addresses of the sequential pattern memory 11. The sequential pattern memory 11 is a memory (for example, magnetic tape device, etc.) for executing read and write of data by accessing values of consecutive address data (sequential access) such that values of the address data 10a are incremented one by one such as . . . →4096→4097→4098→ 4099 . . . or same values of the select data 11a are repeated such as . . . 4101→4101 →. . .

In cases where the address data 10a generated by the address generator 10 are consecutively outputted, the random pattern data 11a stored in the sequential pattern memory 11 are outputted from the sequential pattern memory 11 in accordance with input address values and inputted a first input terminal of the selector 13.

The random pattern memory 12 is a memory (random access memory such as a dynamic RAM, a static RAM) which can arbitrarily access respective addresses, and random pattern data are previously stored in respective addresses like the sequential pattern memory 11. The random pattern memory 12 outputs the random pattern data 12a which are stored therein in accordance with values of address data 10a outputted from the address generator 10 and inputs to a second input terminal of the selector 13. The selector 13 selects either the input data 11a or input data 12a in response to the selection signal 10b and outputs the selected data as random pattern data.

The pattern generator for use in a semiconductor test device writes a program on the address generator 10 appropriately in accordance with the content of test or a semiconductor device to be tested and tests on the semiconductor device to be tested using the random pattern data stored in the sequential pattern memory 11 or the random pattern memory 12.

However, the sequential pattern memory 11 has generally large capacity but it is late in time for outputting data stored in addresses after the addresses are specified, namely, it is a so-called slow speed memory. On the other hand, the random pattern memory 12 is a high speed memory but it has small capacity compared with the sequential pattern memory 11. Accordingly, the conventional pattern generator for use in a semiconductor test device requires an expensive memory which runs at high speed and has large capacity for generating random pattern data of high speed with large capacity, and hence it has been difficult to allow the pattern generator to run at high speed, to be small sized and to manufacture at low cost.

SUMMARY OF THE INVENTION

The present invention has been made under the circumstances and has an object to provide a pattern generator for use in a semiconductor test device capable of generating random pattern data having large capacity at high speed using a random access memory which runs at high speed and has low capacity.

To achieve the above object, a first aspect of the present invention comprises a pattern generator for use in a semiconductor test device for supplying random pattern data to a semiconductor device to be tested comprising first memory means for previously storing random pattern data therein, and second memory means for storing parts of random pattern data stored in the first memory means and outputting the same parts to the semiconductor device to be tested.

A second aspect of the present invention is the pattern generator for use in a semiconductor test device of the first aspect of the invention wherein the second memory means includes addressing means for specifying addresses for storing parts of the random pattern data.

A third aspect of the present invention is the pattern generator for use in a semiconductor test device of the first aspect of the invention further comprising selection means for outputting either the random pattern data outputted from the first memory means or the random pattern data outputted from the second memory means to the semiconductor device to be tested.

A fourth aspect of the present invention is the pattern generator for use in a semiconductor test device of the first aspect of the invention wherein the first memory means is a sequential access memory and the second memory means is a random access memory.

PREFERRED EMBODIMENT OF THE INVENTION

A pattern generator for use in a semiconductor test device according to a preferred embodiment of the present invention will be described now with reference to FIGS. 1 to 3.

Figure 1:
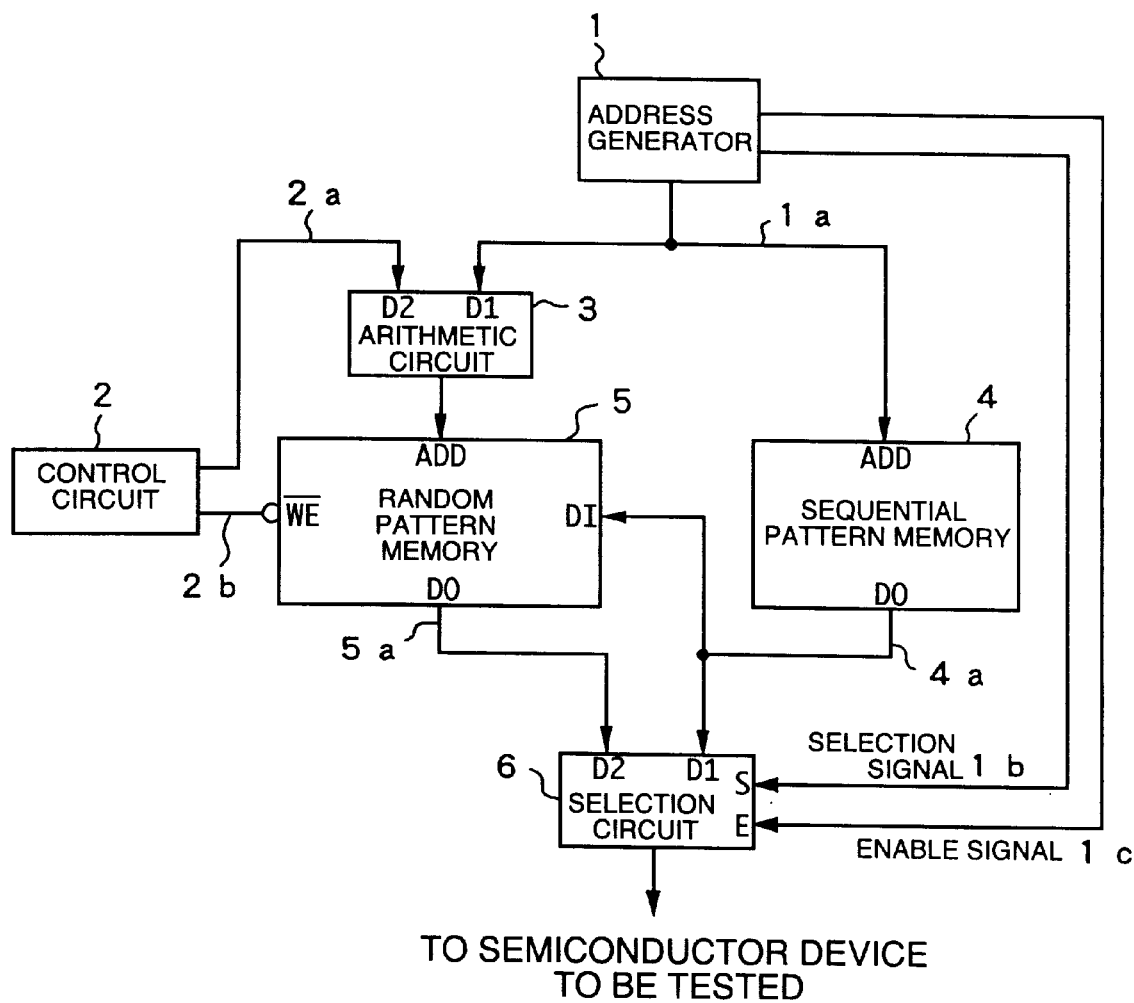
FIG. 1 is a block diagram showing the construction of a pattern generator for use in a semiconductor test device according to a preferred embodiment of the present invention.
Figure 2:
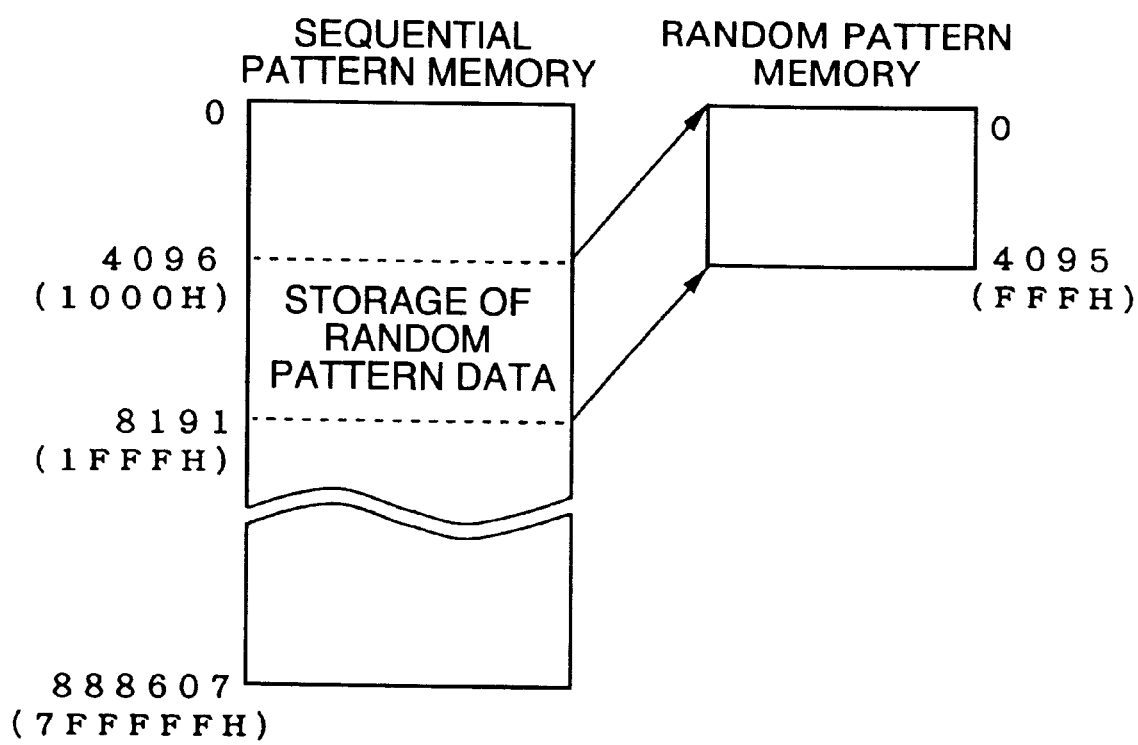
FIG. 2 is a view for explaining data transfer from a sequential pattern memory 4 to a random pattern memory 5 of the pattern generator for use in a semiconductor test device in FIG. 1.

FIG. 1 is a block diagram showing the construction of a pattern generator for use in a semiconductor test device according to a preferred embodiment of the present invention. In FIG. 1, an address generator 1 outputs address data 1a, a selection signal 1b and an enable signal 1c in accordance with a program which has been previously written thereon. The content of these signals are described later.

A control circuit 2 outputs address specification data 2A for specifying write address or read address of a random pattern memory 5, described later, and a control signal 2b for executing write/read control of the random pattern memory 5.

An arithmetic circuit 3 subtracts values of address specification data 2a supplied to a second input terminal D2 thereof from values of address data 1a supplied to a first input terminal D1 thereof.

Figure 4:
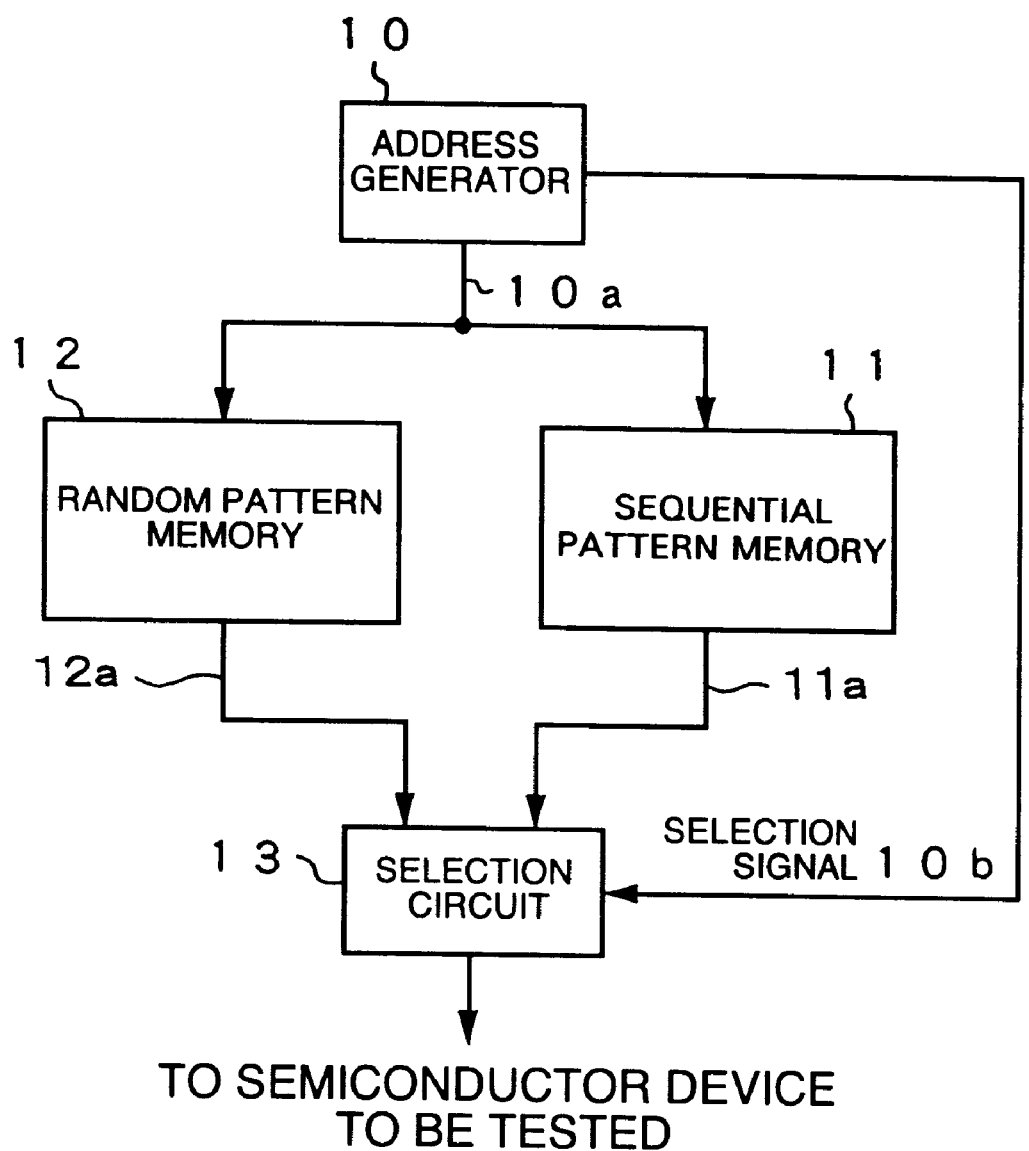
FIG. 4 is a block diagram showing the construction of a conventional pattern generator for use in a semiconductor test device.

A sequential pattern memory or sequential access memory 4 executes read and write of data by sequential or serial access like the sequential pattern memory 11 shown in FIG. 4.

Random pattern data are previously stored in respective addresses of the sequential pattern memory 4, and the sequential pattern memory 4 outputs data 4a stored in the respective addresses from its output terminal D0 when values of the address data 1a supplied to its address input terminal ADD are consecutive.

A random pattern memory or random access memory 5 is the same as the random pattern memory 12 shown in FIG. 4 and outputs data 5a stored in addresses which are specified by values of an arithmetic operation result of the arithmetic circuit 3 which values are inputted to an input terminal ADD when a control signal 2b which is supplied to a write/read control terminal $\overline{WE}$ is "1". Further, data supplied to a data input terminal DI of the random pattern memory 5, namely, the data 4a outputted from the sequential pattern memory 4 are written on addresses of the random pattern memory 5 which are specified by the values of the arithmetic operation result when the control signal 2b outputted from the control circuit 2 is "0".

A selection circuit 6 outputs either the data 4a or data 5a which are respectively inputted to a first input terminal D1 and a second input terminal D2 thereof in accordance with the selection signal 1b which is supplied from the address generator 1 to a selection signal input terminal S thereof. The selection circuit 6 selects the data 4a when the selection signal 1b is at "1", while it selects the data 5a when the selection signal 1b is at "0".

Meanwhile, the enable signal 1c is supplied from the address generator 1 to an enable terminal E of the selection circuit 6 and the selection circuit 6 invalidates the output of the selected data in response to the enable signal 1c. The selection circuit 6 outputs the selected data when the enable signal is at "1" and does not output the selected data when the enable signal is at "0".

Various signals generated by the address generator 1 will be next described. First of all, a program written in the address generator 1 determines whether the address data 1a is generated sequentially or at random. Further, the selection signal 1b is programmed in the manner that the selection circuit 6 selects the data 4a outputted from the sequential pattern memory 4 (namely, the selection signal 1b is at "1") while the address data 1a are sequentially generated, and the selection circuit 6 selects the data 5a outputted from the random pattern memory 5 (namely, the selection signal 1b is at "0") while the address data 1a are generated at random.

The enable signal 1c is programmed in the manner that it is rendered at "0" to invalidate the output of the selection circuit 6 while the data stored in the sequential pattern memory 4 are written on the random pattern memory 5, and it is rendered at "1" to validate the output of the selection circuit 6 other than the above case.

Described next is the operation of the pattern generator for use in a semiconductor test device when the 8k byte random pattern data are supplied from the random pattern memory 5 to the semiconductor device to be tested (not shown) supposing that the capacity of the random pattern memory 5 is 4k bytes.

Before the test is made on the semiconductor device to be tested, 4k byte random pattern data are stored previously in addresses 0 to 4095 of the random pattern memory 5 and 4k byte random pattern data are stored in addresses 4096 to 8191 of the sequential pattern memory 4.

When the test is started, the address specification data 2a and control signal 2b outputted from the control circuit 2 are respectively rendered at "0" and "1". In this state, the address data 1a of "0" to "4095" (decimal number, the address values are hereinafter indicated by decimal number) are outputted at random from the address generator 1. At this time, the selection signal 1b is rendered at "0" and the enable signal 1c is rendered at "1" so that the selection circuit 6 selects the data 5a outputted from the random pattern memory 5 and outputs the data to the semiconductor device to be tested.

When all the random pattern data stored in the random pattern memory 5 are outputted, the data which are stored in addresses 4096 to 8191 of the sequential pattern memory 4 are transferred to the addresses 0 to 4095 of the random pattern memory 5. The states of various signals at this time are illustrated in FIGS. 3(A) to 3(E). FIG. 3(A) shows the values of address data 1a outputted from the address generator 1, FIG. 3(B) shows the values of the address specification data 2a outputted from the control circuit 2, FIG. 3(C) shows the address values supplied to the address input terminal ADD of the random pattern memory 5 from the arithmetic circuit 3, FIG. 3(D) shows the data 4a outputted from the sequential pattern memory 4, and FIG. 3(E) shows the content of the control signal 2b outputted from the control circuit 2.

When the data transfer is started, the control circuit 2 first outputs "4096" as the address specification data 2a (see FIG. 3(B)). Subsequently, the address generator 1 sequentially increments the values of address data 1a from "4096" to "8191" one by one, and outputs them to the arithmetic circuit 3 and the sequential pattern memory 4 (see FIG. 3(A)). As a result, for example, when the address data 1a is "4096", the sequential pattern memory 4 reads the address of "4096" and outputs the data 4a written thereon. Suppose that the data written on the address "4096" is "D0" (see FIG. 3(D)).

Meanwhile, the arithmetic circuit 3 subtracts the address specification data 2a from the address data 1a outputs the arithmetic operation result to the random pattern memory 5. That is, in this case, the arithmetic operation result, namely "4096"−"4096"="0" is supplied to the address input terminal ADD of the random pattern memory 5. The control circuit 2 outputs the control signal 2b as "0" to the write/read control terminal $\overline{WE}$ of the random pattern memory 5. As a result, the data "D0" is written on the address "0" of the random pattern memory 5 (see FIGS. 3 (C) to (E)).

Next, the address generator 1 outputs "4097" as the address data 1a. Accordingly, the sequential pattern memory 4 outputs the data "D1" written on the address "4097" and supplies it to the data input terminal D1 of the random pattern memory 5. The arithmetic circuit 3 subtracts the value "4096" of the address specification data 2a from the value "4097" of the address data 1a, and the result of subtraction, namely "4097"–"4096"="1" is supplied to the address input terminal ADD of the random pattern memory 5. When the control signal 2b of the control circuit 2 is at "0", the data "D1" is written on the address "1" of the random pattern memory 5.

Figure 3:
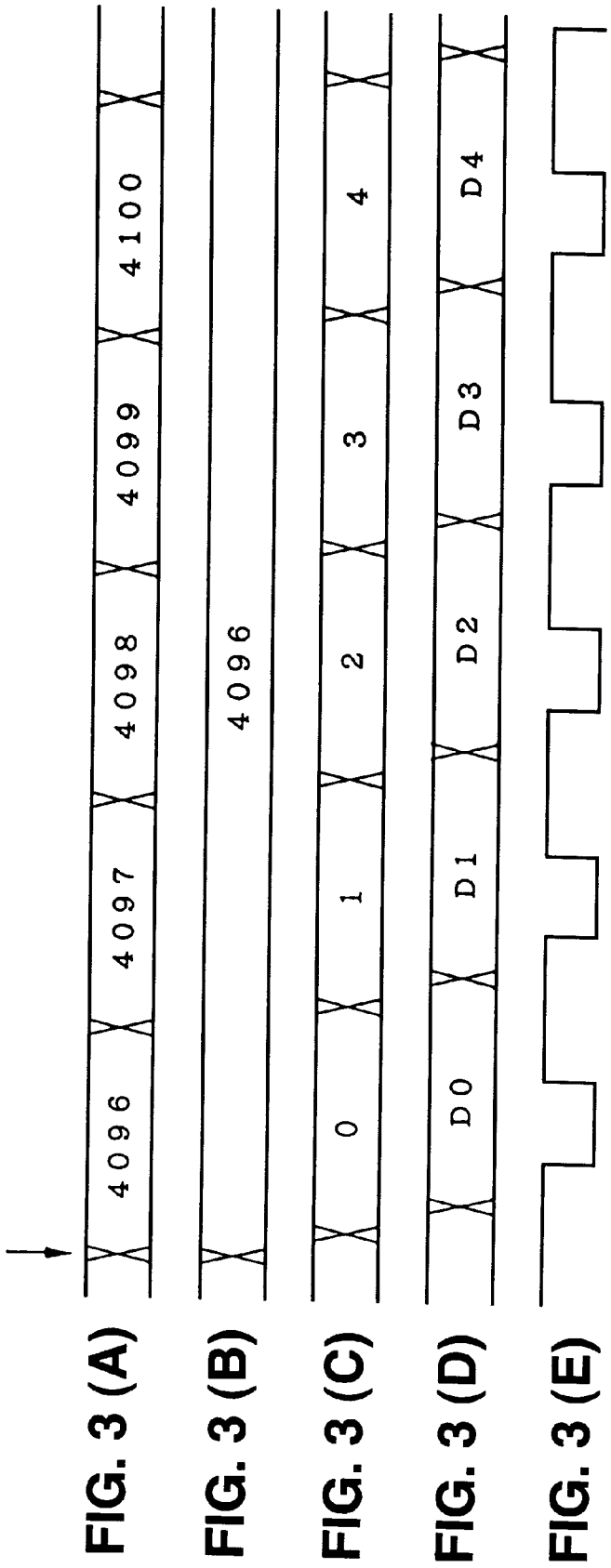
FIGS. 3 (A) to 3 (E) are timing charts of various signals generated when transferring data.

Thereafter, address data "4098" to "8191" are sequentially outputted from the address generator 1 (see FIG. 3 (A)), and finally the data written on the addresses "4096" to the address "8191" of the sequential pattern memory 4 are transferred to the addresses "0" to "4095" of the random pattern memory 5. During the data transfer, the enable signal 1c is at "0", so that the random pattern data are not outputted from the selection circuit 6.

When the data transfer is completed, the enable signal 1c is rendered at "1" and the control signal 2b is rendered at "0". The address generator 1 generates the address data 1a "4096" to "8191" at random. Accordingly, the data stored in the addresses "4096" to "8191" of the control circuit 2 are outputted from the random pattern memory 5. Further, at this time, since the selection signal 1b is at "0", and the enable signal 1c is at "1", the data 5a outputted from the random pattern memory 5 is outputted from the selection circuit 6.

Upon completion of outputting 8k byte (in total) random pattern data after the random pattern data stored in the random pattern memory 5 are used, the operation of the pattern generator according to the preferred embodiment is completed.

In the pattern generator for use in a semiconductor test device according to the preferred embodiment, the data written on the sequential pattern memory 4 are sequentially transferred to the random pattern memory 5 conforming to the capacity of the random pattern memory, and the random pattern data are outputted from the random pattern memory so that the random pattern data having the capacity larger than that of the random pattern memory can be generated at high speed.

In the case set forth above, when the 4k byte random pattern data to be transferred from the sequential pattern memory 4 to the random pattern memory 5 are stored in the addresses "4096" to "8191", but they are not limited to be stored in such addresses. That is, for example, the 4k byte random pattern data to be stored in the control circuit 2 can be stored in the addresses "0" to "4095", wherein the values of addresses "0" to "4095" are sequentially generated in the address generator 1, and the address specification data 2b at this time may be rendered at "0".

Further, according to the preferred embodiment set forth above, although the selection circuit 6 exclusively selects the data 5a outputted from the random pattern memory 5 and outputs them therefrom, a program to be written on the address generator 1 may be changed so that the data 4a outputted from the sequential pattern memory 4 may be outputted from the selection circuit 6, if need be. That is, when outputting the data 4a stored in the sequential pattern memory 4, the values of the address data 1a are sequentially incremented and outputted to render the selection signal 1b at "0" and the enable signal 1c at "1".

Further, according to the preferred embodiment set forth above, although a case where the 8k byte (in total) random pattern data are supplied to the semiconductor device to be tested is explained, it is possible to supply 8k byte or more (in total) random pattern data from the random pattern memory 5. In this case, the 4k byte or more random pattern data are previously stored in the sequential pattern memory 4, and every time the data stored in the random pattern memory 5 are outputted, the data transfer is repeatedly executed to output the 8k bytes or more random pattern data in total from the random pattern memory 5.

Still further, according to the preferred embodiment, although the 4k byte random pattern data are previously stored in the random pattern memory 5 and the sequential pattern memory 4 before making a test on the semiconductor device to be tested, it may be possible that the 8k byte random pattern data are stored in the sequential pattern memory 4 alone without storing any data in the random pattern memory 5, and at the start of making a test, the 4k byte data are transferred from the sequential pattern memory 4 to the random pattern memory 5 and are outputted therefrom, then the remaining 4k byte data are transferred.

As mentioned in detail above, according to the present invention, parts of the random pattern data stored in the first storage means which has a large capacity and runs at low speed are transferred to the second storage means which has low capacity and runs at high speed, so that the transferred random pattern data can be outputted from the second storage means to the semiconductor device to be tested. As a result, there is an effect of the pattern generator for use in a semiconductor test device that random pattern data having a large capacity can be generated at high speed using the random access memory which has a small capacity but runs at high speed without needing a random access memory which has large capacity and runs at high speed, so that the high speed, low sized memory can be manufactured at low cost.

What is claimed is:

1. A pattern generator for use in a semiconductor test device for supplying random pattern data to a semiconductor device to be tested, comprising:
   first memory means for outputting first random pattern data stored therein; and
   second memory means for receiving and storing at least part of the first random pattern data output from the first memory means.

2. The pattern generator of claim 1, including selection means for outputting either the first random pattern data output from said first memory means or second random pattern data from said second memory means that includes part of the first random pattern data from the first memory means to the semiconductor device to be tested.

3. The pattern generator of claim 1, wherein said first memory means comprises a sequential access memory device and said second memory means comprises a random access memory device.

4. The pattern generator of claim 1, wherein said second memory means outputs second random pattern data stored therein including part of the first random pattern data.

5. The pattern generator of claim 4, including addressing means for specifying address data to the first memory means.

6. The pattern generator of claim 5, including a control circuit for providing a control signal to read/write from the second memory means and for providing address specification data.

7. The pattern generator of claim 6, including an arithmetic circuit for receiving the address data from said addressing means and for receiving the address specification data from said control circuit, said arithmetic circuit subtracting the address specification data from the address data and providing the subtracted address data to said second memory means.

8. The pattern generator of claim 7, including a selection circuit for selectively outputting the second random pattern data output from said second memory means or selectively outputting the first random pattern data output from said first memory means, the selection circuit sending the selected random pattern data to the semiconductor device to be tested in response to a selection signal from said addressing means.

9. A pattern generator for use in a semiconductor test device for supplying test data to a semiconductor device to be tested, comprising:

an address generator for outputting address data;

a sequential pattern memory device for receiving the address data from said address generator and outputting first test data stored therein at respective addresses corresponding to individual addresses set forth in the address data; and a random pattern memory device for receiving and storing at least part of the first test data from the sequential pattern memory device and for outputting second test data to the semiconductor to be tested, the second test data including part of the first test data received from the sequential pattern memory device.

10. The pattern generator of claim 9, including a control circuit for providing a control signal to read/write from the random pattern memory device for providing address specification data.

11. The pattern generator of claim 10, including an arithmetic circuit for receiving the address data from said address generator and for receiving the address specification data from said control circuit, said arithmetic circuit subtracting the specification data from the address data and providing subtracted address data to said random pattern memory device.

12. The pattern generator of claim 11, including a selection circuit for receiving the second test data output from said random pattern memory device and the first test data output from said sequential pattern memory device, the selection circuit selecting the test data to be sent to the semiconductor device to be tested in response to a selection signal from said address generator.

13. The pattern generator of claim 12, wherein said address generator provides an enable signal to said selection circuit; the address data, the selection signal and the enable signal being provided by the address generator in accordance with a computer program.

14. The pattern generator of claim 9, wherein said sequential pattern memory device comprises a serial access memory device.

15. The pattern generator of claim 14, wherein said serial access memory device comprises a magnetic storage device.

16. The pattern generator of claim 9, wherein said random pattern memory device comprises a random access memory device.

* * * * *